(12) United States Patent
Gregory

(10) Patent No.: US 7,142,029 B2
(45) Date of Patent: Nov. 28, 2006

(54) OPERATIONAL FREQUENCY RANGE OF LATCH CIRCUITS

(75) Inventor: Christopher Edward Gregory, Wigginton (GB)

(73) Assignee: Selex Sensors and Airborne Systems Limited, Basildon (GB)

( * ) Notice: Subject to any disclaimer, the term of this patent is extended or adjusted under 35 U.S.C. 154(b) by 12 days.

(21) Appl. No.: 10/502,438

(22) PCT Filed: Jun. 18, 2004

(86) PCT No.: PCT/GB2004/002600

§ 371 (c)(1),
(2), (4) Date: Jul. 22, 2004

(87) PCT Pub. No.: WO2005/002053

PCT Pub. Date: Jan. 6, 2005

(65) Prior Publication Data

US 2005/0280460 A1    Dec. 22, 2005

(30) Foreign Application Priority Data

Jun. 27, 2003  (EP)  ................... 03254112
Jun. 27, 2003  (GB)  ................... 0314999.4

(51) Int. Cl.
*H03K 3/289* (2006.01)
*H03K 3/356* (2006.01)

(52) U.S. Cl. .................. 327/202; 327/203; 327/218
(58) Field of Classification Search .................. None
See application file for complete search history.

(56) References Cited

U.S. PATENT DOCUMENTS 4,289,979 A * 9/1981 Muller .................. 327/204
4,922,127 A * 5/1990 Denny .................. 327/247
6,452,433 B1 * 9/2002 Chang et al. ............. 327/202

FOREIGN PATENT DOCUMENTS

EP    0 325 418 A2    7/1989
GB    2 367 963 A     4/2002

OTHER PUBLICATIONS

Ishii et al, Very-High-Speed Si Bipolar Static Frequency Dividers With New T-Typ0e Flip-Flops, IEEE Journal Of Solid-State Curcuits, vol. 30, No. 1, Jan. 1995, pp. 19-24—XP-002258731.
Runge, Submicron Silicon Bipolar Master-Slave D-Type Flip-Flop For Use As 8.1 Gbit/s Decision Circuit And 11.2 Gbit/s Demultiplexer, Electronic Letter, vol. 2, No. 20, Sep. 28, 1989, pp. 1346-1347—XP-000074373.
Hauenschild et al., A 10Gb/s BiCMOS Clock and Data Recovering 1:4-Demultiplexer in a Standard Plastic Package with External VCO, 1996 IEEE International Solid-State Circuits Conference, pp. 202-203 and 445, XP000685596.
PCT Search Report dated Oct. 7, 2004.
EP Search Report dated Nov. 10, 2003.
United Kingdom Search Report dated Oct. 13, 2003.

* cited by examiner

*Primary Examiner*—Tuan T. Lam
(74) *Attorney, Agent, or Firm*—Buchanan, Ingersoll and Rooney PC

(57) ABSTRACT

Described herein is a latch circuit (110) which has an improved maximum toggle rate or frequency. The latch circuit (110) includes a first portion (116) and a second portion (62) in which input clock signals (52,54) are applied to respective input transistors (118,78). The input transistor (118) for the first portion (116) has an emitter area which is double that of the input transistor (78) for the second portion (62). This 'imbalance' between the two input transistors (118,78) provides an increase in the 'hold period/follow period' ratio such that it is greater than 1, the self-resonance of the latch circuit (110) and also maximum toggle rate or frequency.

5 Claims, 5 Drawing Sheets

Typical divide_by_2

OPERATIONAL FREQUENCY RANGE OF LATCH CIRCUITS

The present invention relates to improvements in or relating to the operational frequency range of latch circuits and is more particularly, although not exclusively, concerned with improvements relating to 'hold/follow' latches.

It is common to use a 'divide-by-2' prescaler in many types of circuits. These prescalers consist of two latches, namely, a master latch and a slave latch, both latches changing their modes to either holding or following in accordance with input clock phase. Such latches are generally known as 'hold/follow' latches.

However, prescalers tend to have a maximum toggle rate or frequency due to their construction. In particular, the maximum toggle rate or frequency tends to be governed by the transistors used to implement the 'hold/follow' latches, the layout parasitics and track path lengths.

It is therefore an object of the present invention to provide an improved prescaler, which has a higher maximum toggle rate.

In accordance with one aspect of the present invention, there is provided a latch circuit including:
a first latch portion including a first clock transistor; and
a second latch portion including a second clock transistor;
wherein the first and second clock transistors form a transistor clock pair and the first clock transistor has a different property or characteristic to the second clock transistor such that the 'hold period/follow period' ratio of the transistor clock pair is greater than 1.

Advantageously, the different property or characteristic comprises a difference in emitter area.

Preferably, the emitter area of the first clock transistor is greater than that of the second clock transistor.

In one embodiment, the emitter area of the first clock transistor is double that of the second clock transistor.

In accordance with another aspect of the present invention, there is provided a prescaler circuit including a first and second latch circuit as described above.

For a better understanding of the present invention, reference will now be made, by way of example only, to the accompanying drawings in which.

Figure 1:
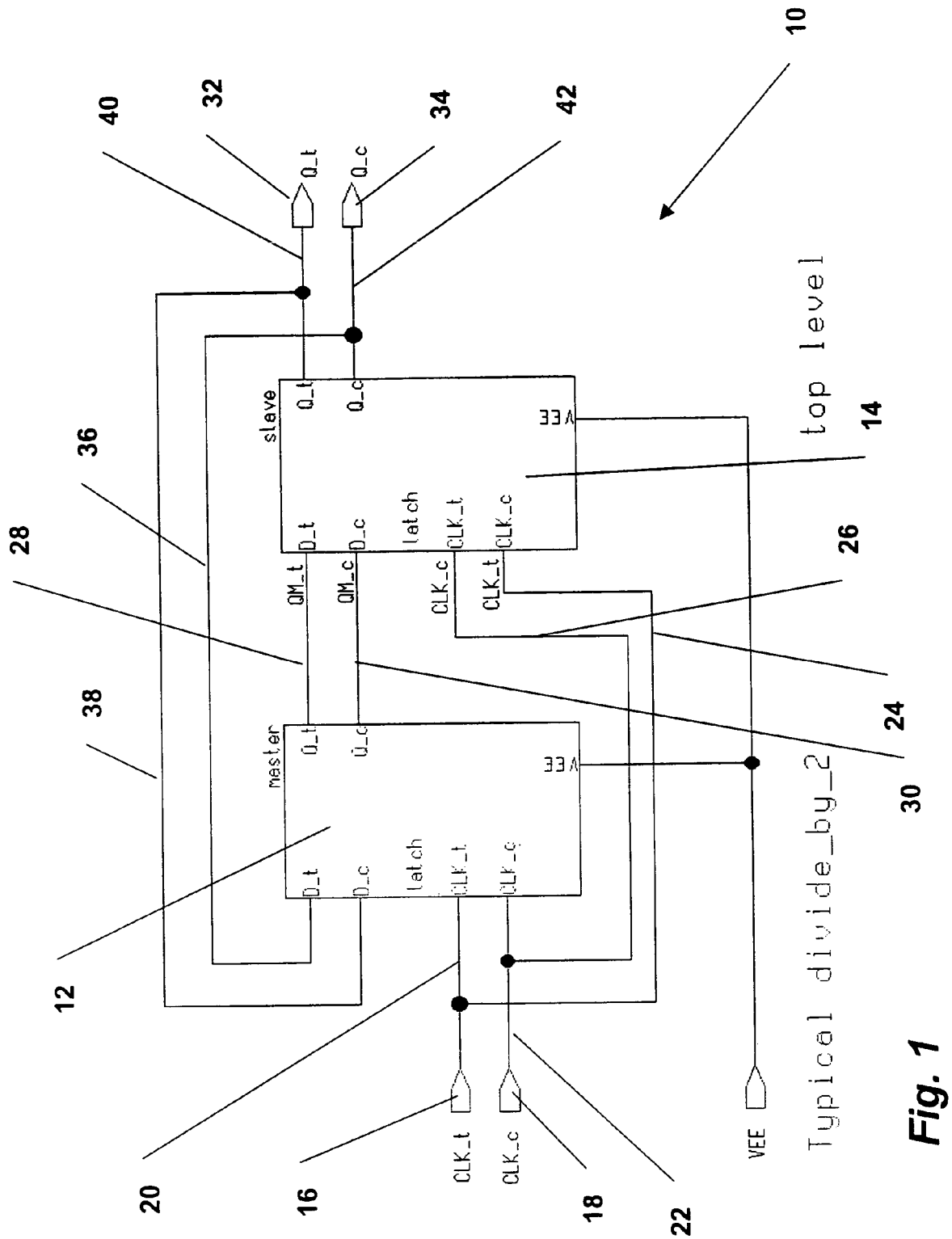
FIG. 1 illustrates a known 'divide-by-2' prescaler.

Referring initially to FIG. 1, a typical 'divide-by-2' prescaler 10 is shown which comprises a master latch 12 and a slave latch 14. Each latch 12, 14 is connected to receive clock inputs 16, 18 along lines 20, 22 and 24, 26 respectively. Clock inputs 16 and 18 are complementary, and when clock input 16 is high, clock input 18 is low and vice versa. The latches 12, 14 are connected together by lines 28, 30 as shown, and are also connected to outputs 32, 34 via respective lines 36, 38 and 40, 42. Lines 40 and 42 comprise the outputs from latch 14 and lines 28 and 30 comprise the outputs from latch 12.

When the clock input 16 to a latch 12 is high and the clock input 18 is low, the data output of latch 12 follows on lines 28 and 30 and the data output of latch 14 holds its current state, that is, the current data. When the clock input 16 is low and the clock input 18 is high, latch 12 holds its current state and latch 14 follows the data. For the prescaler 10 shown in FIG. 1, the outputs 32, 34 toggle their states on the falling edge of clock input 16 as shown in FIG. 2.

Figure 2:
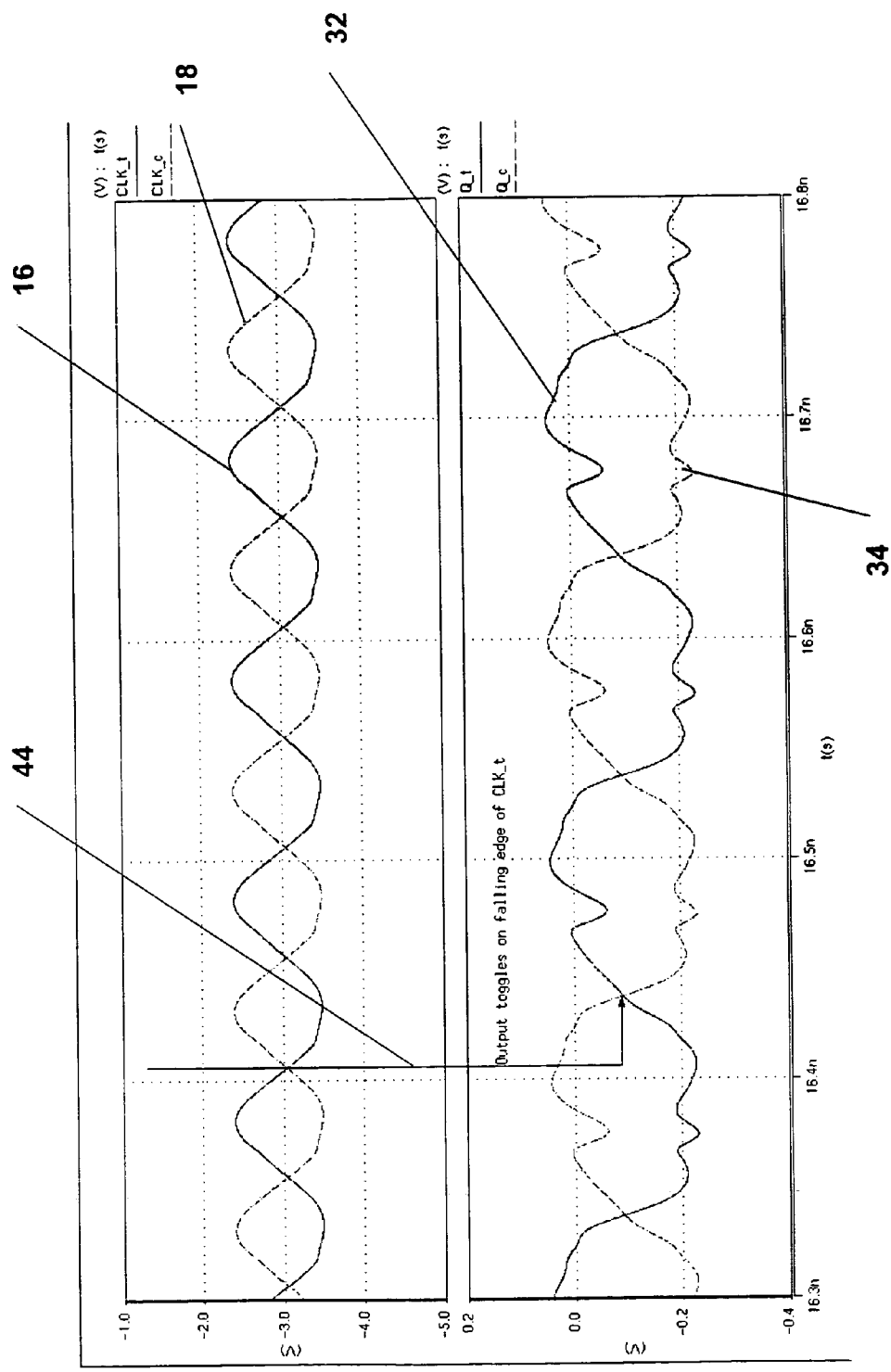
FIG. 2 illustrates the clock signals applied to the FIG. 1 prescaler and the outputs of the master and slave latches thereof.

In FIG. 2, the waveforms of the clock inputs 16, 18 are shown. The waveforms for the outputs 32, 34 are also shown. Line 44 indicates that the outputs 34 toggles on the falling edge of clock input 16.

Figure 3:
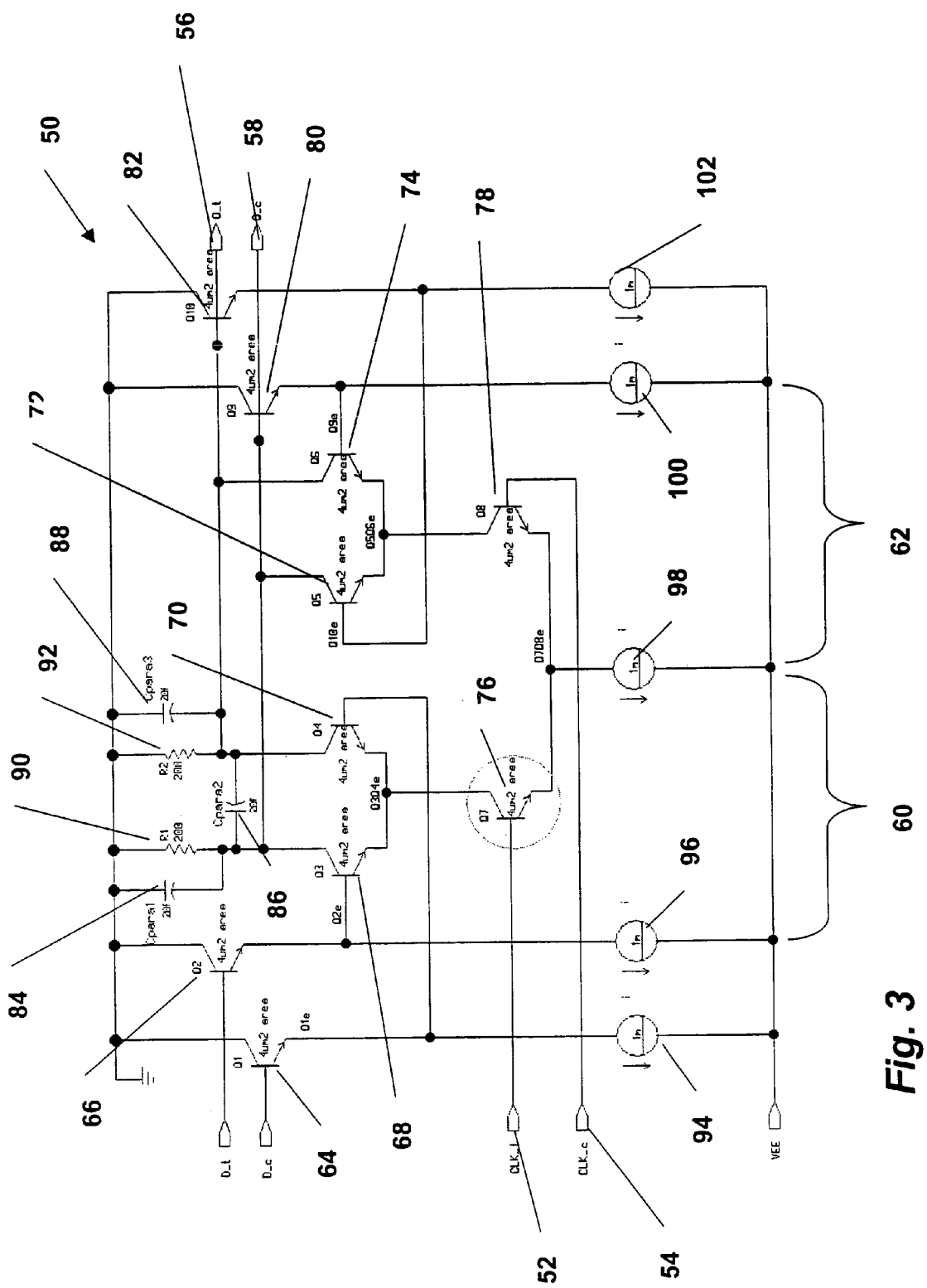
FIG. 3 illustrates a latch circuit in more detail.

FIG. 3 illustrates a latch circuit 50. The latch circuit 50 can be used for both the master and the slave latches 12, 14 of FIG. 1. The circuit 50 includes complementary clock inputs 52, 54 and outputs 56, 58, and is divided into a left portion 60 and a right portion 62. A plurality of bipolar transistors 64, 66, 68, 70, 72, 74, 76, 78, 80, 82 are provided together with three capacitors 84, 86, 88, two resistors 90, 92 and five current sources 94, 96, 98, 100, 102. The transistors 64, 66, 68, 70, 72, 74, 76, 78, 80, 82, resistors 90, 92 and current sources 94, 96, 98, 100, 102 are connected in a known way to carry out the latching function. The capacitors 84, 86, 88 are shown to represent layout 'parasitics' which are typical in a high frequency integrated circuit (IC). These should be minimised to increase toggle rate. The term 'layout 'parasitic'' is well known in this field.

The transistors have been described as being bipolar transistors. They may be both heterojunction or homojunction bipolar transistors.

In FIG. 3, each resistor 90, 92 has the same resistance value. Similarly, all the transistors 64, 66, 68, 70, 72, 74, 76, 78, 80, 82 have the same emitter area of 4 $\mu m^2$. It is to be noted that it is not essential that the values be those illustrated.

In the arrangement shown in FIG. 3, transistors 76, 78 receiving the complementary clock inputs 52, 54 are generally known as a transistor clock pair. The transistor clock pair as shown here is said to be 'balanced', that is, the 'hold/follow' ratio for the latch circuit 50 is 1. The maximum toggle rate or frequency of circuit 50 where it can still just about perform the 'divide-by-2' function is around 12.2 GHz.

It has been found that by doubling the emitter area of transistor 76 to 8 $\mu m^2$ and leaving all the other values the same, an improved maximum toggle rate and frequency gain flatness can be obtained as the 'hold/follow' ratio increases.

Figure 4:
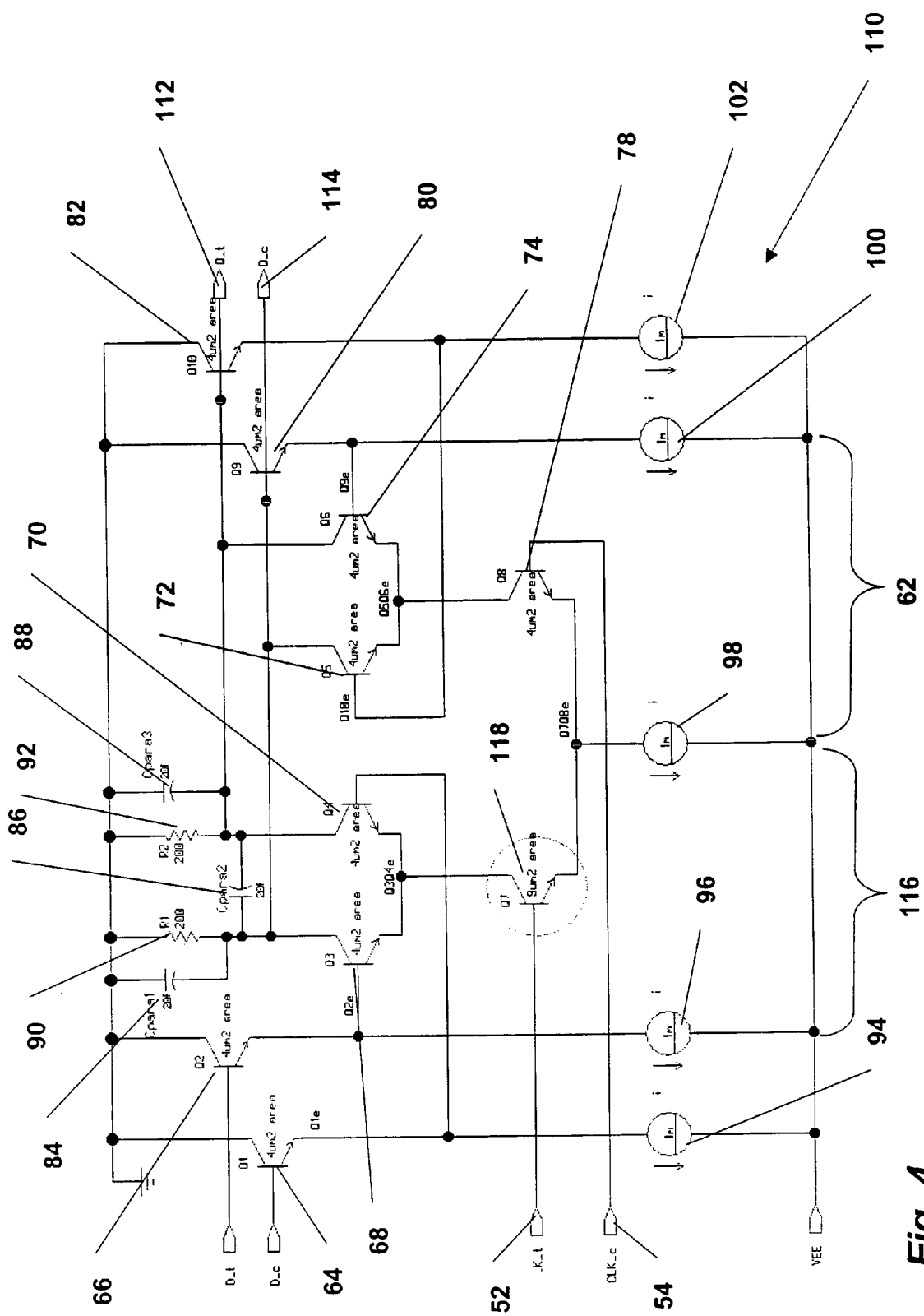
FIG. 4 illustrates a latch circuit in accordance with the present invention.

FIG. 4 illustrates an improved latch circuit 110 which provides the improved maximum toggle rate. Components which are identical to those already described with reference to FIG. 3 are referenced alike. The circuit 110 includes complementary clock inputs 52, 54 as before and has outputs 112, 114, and is divided into a left portion 116 and a right portion 62. Left portion 116 of FIG. 4 differs from left portion 60 of FIG. 3 as it includes a transistor 118 which has a larger emitter area than transistor 76. As before, transistors 118, 78 form a transistor clock pair and receive clock inputs 52, 54. As transistor 118 has a larger emitter area than transistor 76, the transistor clock pair is said to be 'imbalanced' as the 'hold period/follow period' ratio is now greater than 1. This has the effect of increasing the maximum toggle rate to 14 GHz as shown in FIG. 5.

Figure 5:
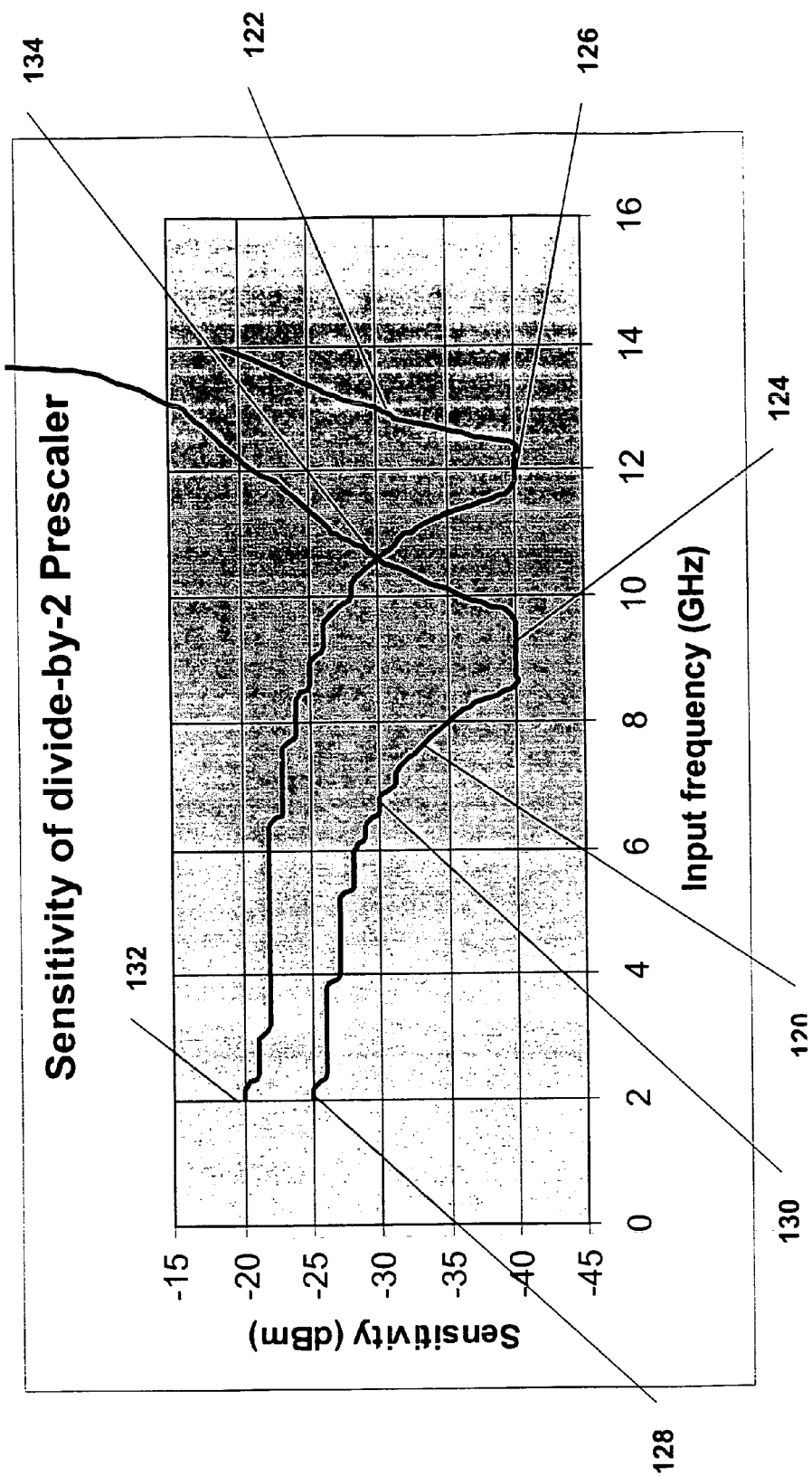
FIG. 5 illustrates the relative sensitivities of the FIG. 3 and FIG. 4 latches.

In FIG. 5, a comparison of the respective sensitivity of latch circuits 50, 110 against input frequency is shown. The sensitivity of the latch circuit 50 is indicated by line 120 and the sensitivity of the latch circuit 110 is indicated by line 122. The self-resonance for the left portion 60, 116 for each latch circuit 50, 110 is indicated by portions 124, 126 respectively of the lines 120, 122. In these regions, the respective left portion 60, 116 is at its most sensitive. It can readily be seen that the self-resonance increases from around 9 GHz to 12 GHz.

For applications which require operation below self-resonance, the latch circuit 110 of FIG. 5 provides substantial benefits. For an operational sensitivity of between −20 dBm and −30 dBm, line 120 shows that the conventional latch circuit 50 has an operational region extending between markers 124, 126 of around between 2 GHz and 7 GHz giving a 5 GHz bandwidth. For the same operational sensitivity, line 122 shows that the improved latch circuit 110 has an operational region extending between markers 128, 130 of around between 2 GHz and 10.5 GHz giving a 8.5 GHz bandwidth. This represents an improvement in operational bandwidth of around 70%.

As mentioned above, the master and slave latches 12, 14 are currently implemented by latch circuit 50 of FIG. 3. By replacing latch circuit 50 with latch circuit 110 in prescaler 10, significant improvements can be made to the maximum toggle rate or frequency of the prescaler 10 without incurring an increase in current consumption or the number of transistors. Additionally, the self-resonance of the prescaler can also be increased.

It will readily be appreciated that, although the invention has been described such that the emitter area of transistor 118 is twice that of transistor 78, it is not limited to this value. The emitter area of transistor 118 can be any suitable multiple of the emitter area of transistor 78 greater than 1 to provide an increased maximum toggle rate or frequency and 'hold/follow' ratio. Naturally, the emitter area of transistor 118 will be chosen in accordance with the particular application.

Although the present invention has been described with reference to bipolar transistors having a change in emitter area to provide the increased maximum toggle rate or frequency and 'hold/follow' ratio, it will be understood that the same principle can also be applied to field effect transistors (FETs). In this case, one or more properties or characteristics of the FET may be changed to provide the increased maximum toggle rate or frequency and 'hold period/follow period' ratio.

It will be appreciated that the benefits discussed above can easily be mapped to a higher yield of integrated circuits for a required performance with an accompanying reduction in production costs.

The invention claimed is:

1. A latch circuit, comprising:
   a first latch portion including a first clock transistor; and
   a second latch portion including a second clock transistor,
   wherein the first and second clock transistors form a transistor clock pair and each of the clock transistors receiving complementary clock inputs to define a 'hold period/follow period' ratio for the transistor clock pair, the first clock transistor having a different emitter area to that of the second clock transistor,
   wherein the emitter area of the first clock transistor is greater than that of the second clock transistor such that the 'hold period/follow period' ratio of the transistor clock pair is greater than 1.

2. The latch circuit according to claim 1, wherein the emitter area of the first clock transistor is double that of the second clock transistor.

3. A prescaler circuit including a first and second latch circuit according to claim 1.

4. A prescaler circuit including a first and second latch circuit according to claim 2.

5. The latch circuit according to claim 1, wherein the first latch portion is a master latch, and the second latch portion is a slave latch.

* * * * *